United States Patent [19]

Arikawa et al.

[11] Patent Number: 5,013,670
[45] Date of Patent: May 7, 1991

[54] PHOTOELECTRIC CONVERTER

[75] Inventors: Shiro Arikawa; Takao Yonehara, both of Atsugi, Japan

[73] Assignee: Canon Kabushiki Kaisha, Tokyo, Japan

[21] Appl. No.: 523,828

[22] Filed: May 15, 1990

Related U.S. Application Data

[63] Continuation of Ser. No. 225,579, Jul. 28, 1988, abandoned, which is a continuation of Ser. No. 95,447, Sep. 11, 1987, abandoned.

[30] Foreign Application Priority Data

Sep. 18, 1986 [JP] Japan .................. 61-218140

[51] Int. Cl.$^5$ .................. H01L 31/18; H01L 21/20
[52] U.S. Cl. .................. 437/2; 148/DIG. 152; 437/83; 437/90
[58] Field of Search .................. 357/30; 148/DIG. 11, 148/22, 25, 26, 72, 97, 120, 150, 152, 172, 33, 33.2, 33.3; 156/603, 610–614, 644, 662; 427/248.1, 255.1; 437/2–5, 62, 81, 83, 82, 84, 89, 90, 108, 112, 126, 173, 247, 916, 970, 973, 976

[56] References Cited

U.S. PATENT DOCUMENTS

| 3,574,008 | 4/1971 | Rice | 437/89 |
|---|---|---|---|
| 3,620,833 | 11/1971 | Gleim et al. | 437/83 |
| 3,793,712 | 2/1974 | Bean et al. | 437/90 |
| 4,131,496 | 12/1978 | Weitzel et al. | 437/62 |
| 4,174,422 | 11/1979 | Mathews et al. | 156/613 |
| 4,193,836 | 3/1980 | Youmans et al. | 437/62 |
| 4,228,446 | 10/1980 | Kramer | 357/30 |
| 4,279,688 | 7/1981 | Abrahams et al. | 156/613 |
| 4,479,847 | 10/1984 | McCaldin et al. | 156/624 |
| 4,584,025 | 4/1986 | Takaoka et al. | 437/84 |
| 4,670,088 | 6/1987 | Tsaur et al. | 156/617 R |
| 4,686,554 | 8/1987 | Ohmi et al. | |
| 4,749,441 | 6/1988 | Christenson et al. | 437/89 |

FOREIGN PATENT DOCUMENTS

| 0132076 | 1/1985 | European Pat. Off. | |
|---|---|---|---|
| 3446972 | 7/1985 | Fed. Rep. of Germany | 357/30 |
| 58-17785 | 2/1983 | Japan | 357/30 |
| 58-25220 | 2/1983 | Japan | 437/90 |
| 0056406 | 4/1983 | Japan | 437/89 |
| 58-148474 | 9/1983 | Japan | 357/30 |
| 0028327 | 2/1984 | Japan | 437/83 |
| 60-140879 | 7/1985 | Japan | |
| 61-145861 | 7/1986 | Japan | 357/30 |
| 61-199659 | 9/1986 | Japan | 357/30 |
| 61-199661 | 9/1986 | Japan | |

Primary Examiner—Olik Chaudhuri
Assistant Examiner—William Bunch
Attorney, Agent, or Firm—Fitzpatrick, Cella, Harper & Scinto

[57] ABSTRACT

A photoelectric conversion device includes a light transmissive substrate having a deposition surface and a bottom surface. The bottom surface receives light and passes it through the substrate. A heterogeneous deposition surface is formed on the substrate deposition surface and has a nucleation density higher than the nucleation density of the substrate deposition surface. The heterogeneous deposition surface also has an area dimensioned to permit growth of a single nucleus of a single crystal material. A photoelectric conversion collector is formed of the single crystal material grown on the heterogeneous deposition surface. The collector receives light passed through the substrate bottom surface. Photoresponsive transistor elements are formed in and on the collector for outputting a signal corresponding to the light received by the collector through the bottom of the light transmissive substrate. Thus, electrical wiring and transistor elements are formed on the top of the collector, away from the collector surface which receives the light.

5 Claims, 10 Drawing Sheets

PHOTOELECTRIC CONVERTER

This application is a continuation of application Ser. No. 095,447 filed Sept. 11, 1987 which is a continuation of application Ser. No. 07/225,579 filed Jul. 28, 1988, now abandoned.

BACKGROUND OF THE INVENTION

1. Field of the Invention

The present invention relates to a photoelectric converter having a photoelectric charge storage area whose potential thereof controlled through a capacitor.

2. Related Background Art

A photoelectric converter having a photoelectric charge storage area whose potential is controlled through a capacitor is known, for example, by European Patent Publication No. 132076.

Such a converter will be briefly explained below.

Figure 1A:
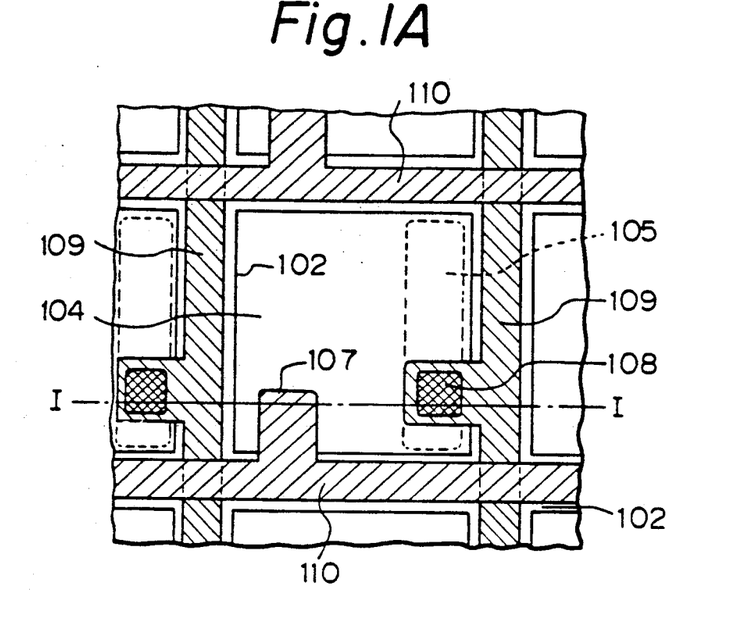
FIG. 1(A) shows a plan view of a photoelectric converter.
Figure 1B:
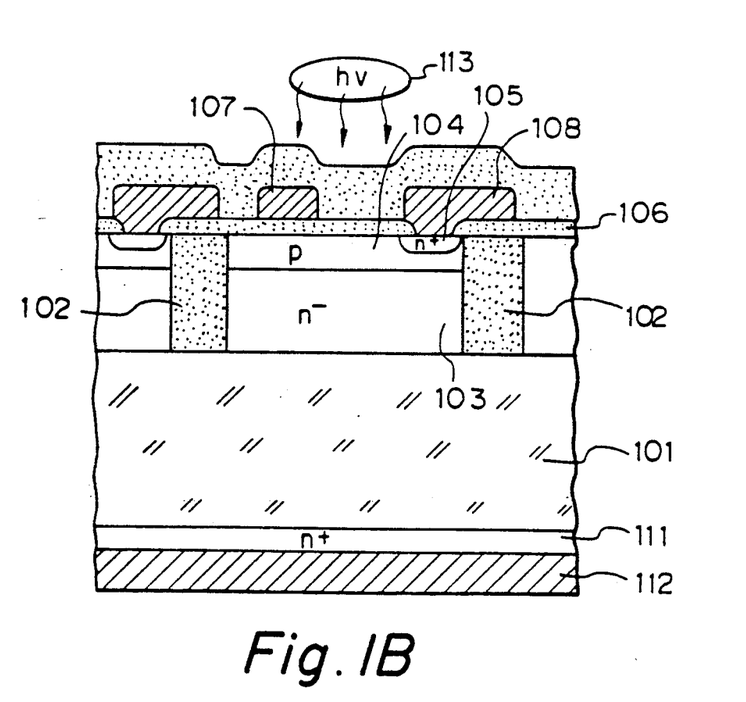
FIG. 1(B) shows a I—I sectional view thereof.

FIG. 1(A) shows a plan view of the photoelectric converter and FIG. 1(B) shows a I—I cross-sectional view thereof.

Photoelectric conversion cells are arranged on an n-type silicon substrate 101 and each photoelectric conversion cell is electrically insulated from adjacent photoelectric conversion cells by a device isolation area 102 made of $SiO_2$, $Si_3N_4$ or polysilicon.

Each photoelectric conversion cell is constructed as follows. A p region 104 is formed on a low impurity density n− region 103 by doping with a p-type impurity (for example, boron). An and n+ region 105 is formed in the p region 104 by impurity diffusion or ion injection. The p region 104 and the n+ region 105 are the base and emitter of an NPN bipolar transistor, respectively.

An oxidation film 106 is formed on the regions formed over region 103, and a capacitor electrode 107 having a predetermined area is formed on the oxidation film 106. The capacitor electrode 107 faces the p region 104 with the oxidation film 106 being interleaved therebetween, and a potential of the floating p region 104 is controlled by applying a pulse voltage to the capacitor electrode 107.

Also formed on the cell are an emitter electrode 108 connected to the n+ region 105, wiring 109 for externally reading a signal from the emitter electrode 108, wiring 110 connected to the capacitor electrode 107, a high impurity concentration n+ region 111 on the rear side of the substrate 101, and an electrode 112 for applying a potential to the collector of the bipolar transistor.

The basic operation of such a cell will now be explained. It is assumed that the p region 104 which is the base of the bipolar transistor is initially at a negative potential. Light is applied to the p region 104 and holes of electron-hole pairs generated by the incident light are stored in the p region 104 so that the potential of the p region 104 rise toward a positive level (store operation).

Then, a positive read voltage pulse is applied to the capacitor electrode 107 while the emitter electrode 108 floats. When the positive voltage is applied to the capacitor electrode 107, the potential of the p region 104 rises so that the base-emitter is forward biased and a current flows between the collector and the emitter in accordance with the increment of the base potential in the storage operation. Accordingly, an electrical signal corresponding to the incident light intensity appears at the floating emitter electrode 108 (read operation). Since the charge stored in the p region 104 (base) does not substantially decrease, the same optical information can be repetitively read.

In order to remove the holes stored in the p region 104, the emitter electrode 108 is grounded and a refresh positive voltage pulse is applied to the capacitor electrode 107 so that the p region 104 is forward biased relative to the n+ region 105 and the stored holes are removed through the grounded emitter electrode 108. When the refresh positive voltage pulse falls, the base potential of the p region 104 resets to the initial negative potential (refresh operation). Thereafter, the store, read and refresh operations are repeated.

In the proposed system, the charge generated by the light irradiation is stored in the base p region 104 and the current flowing between the emitter electrode 108 and the collector electrode 112 is controlled by the stored charge. Accordingly, the stored charge is read after amplification by the amplification functions of the cells and hence high output, high sensitivity and low noise are attained.

However, this photoelectric converter has a problem described below.

When areas of high density integrated photoelectric conversion cells are very small, an aperture factor is very low and wiring capacitance increases. In other words, a potential $V_p$ generated by the holes stored in the base by the light excitation decreases.

The increase of the wiring capacitance may be prevented by increasing the thickness of the insulative layer between the photoelectric conversion cell and the wiring material or by using a low dielectric constant material, but the reduction of the aperture factor cannot be prevented because the wiring electrode and the device isolation area exist on the photoelectric conversion cell. As a result, the larger the circuit scale is and the higher the integration density is, the lower the output level.

In a prior art method, the die or pigment used for an on-chip color filter is deposited directly on the cell. As a result, contamination materials in the die or pigment more easily into the cell. This causes a problem in reliability.

SUMMARY OF THE INVENTION

It is an object of the present invention to provide a photoelectric converter comprising a semiconductor transistor having a main electrode region of one conductivity type semiconductor and a control electrode region of the opposite conductivity type semiconductor. A capacitor is provided for controlling the potential of the floating control electrode to store carriers generated by light in the control electrode the capacitor also reads the stored voltage and refreshes the stored a deposition surface ($S_{NDL}$) of a heterogeneous material (which has a higher nuclear formation density than that of the material forming the deposition surface ($S_{NDS}$)) and having an area which is fine enough to permit growth of only one nucleus of the deposit material, is formed on a light transmissive substrate. Photoelectric cells are formed in a single crystal region grown around the single nucleus formed in the heterogeneous material.

In accordance with the present invention, the single crystal region is formed in the deposit in a recess formed in the light transmissive substrate, and the photoelectric conversion cells are formed in the single crystal region so that the light may be applied to a back side of the cell.

The single crystal region may be formed by a semiconductor process described later herein.

There is no restriction on the substrate material such as that in the SOS (silicon-on-saphire) technique, and no diffusion of aluminum into the cell occurs.

Accordingly, the aperture factor is improved, high integration density is attained and the reliability of the cell is improved because comtamination material does not go into the cell.

DETAILED DESCRIPTION OF THE PREFERRED EMBODIMENTS

FIGS. 2(A)-2(E) show longitudinal sectional views for illustrating a manufacturing process of a first embodiment of the photoelectric converter of the present invention.

Figure 2A:
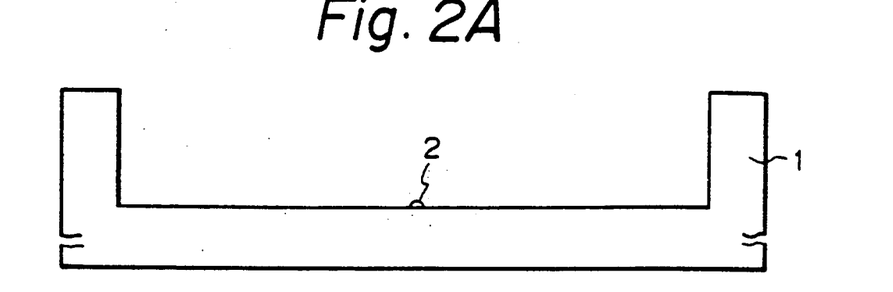
FIGS. 2(A)-2(E) show longitudinal sectional views for illustrating a manufacturing step of one embodiment of the photoelectric converter of the present invention.

As shown in FIG. 2(A), a recess of necessary size and shape is formed in a light transmissive substrate 1, and a heterogeneous material having a high nuclear formation density different from that of the concave structure material is thinly deposited thereon and is patterned by lithography to form a very fine nucleation deposition surface ($S_{NDL}$) formed of heterogeneous material 2. The heterogeneous material 2 may be formed of a modified region having excess Si or Ni formed by ion-injection of Si or Ni into the thin film.

Figure 2B:
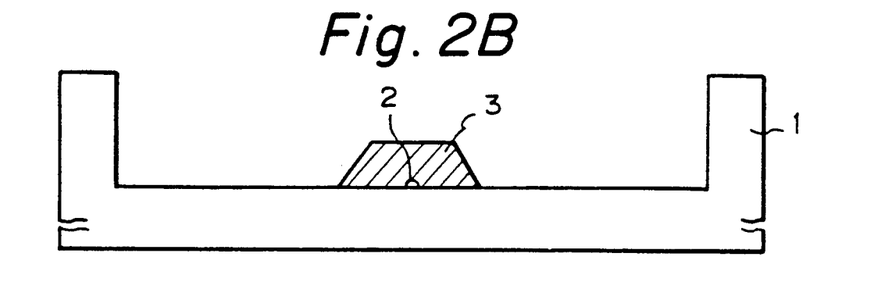
Figure 2C:
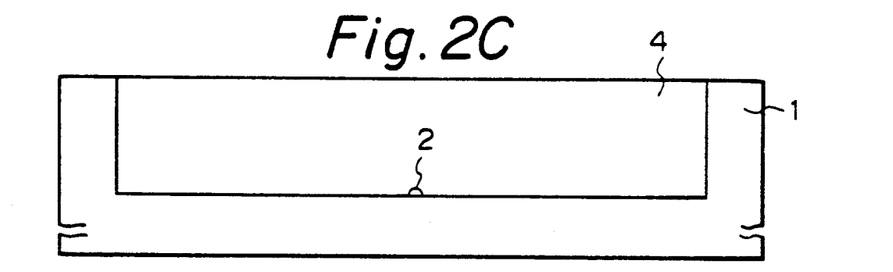

Then, a single nucleus of the thin film material is formed only in the heterogeneous deposition surface ($S_{NDL}$) 2. The heterogeneous deposition surface ($S_{NDL}$) 2 must be fine enough to permit the formation of only one nucleus. The size of the heterogeneous deposition surface ($S_{NDL}$) 2 may be less than several microns, although it may vary with the material. As shown in FIG. 2(B), the thin film material is grown while it maintains the single crystal structure to form an island-shaped single crystal grain 3. The island single crystal grain 3 is further grown around the heterogeneous deposition surface ($S_{NDL}$) 2 while it maintains the single crystal structure, until the single crystal grain 3 fills out the recess. Thus, a single crystal region 4 shown in FIG. 2(C) is formed. A portion of the region 4 serves as a collector region 4-A of the photoelectric conversion device.

Figure 2D:
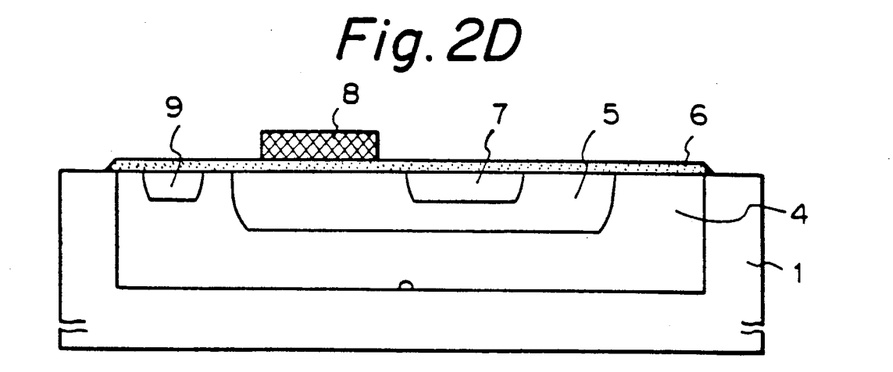

As shown in FIG. 2(D), a base region 5 is formed in a portion of the collector region 4 by using the ion implant method or the thermal diffusion method. Then, a gate oxidation film 6 is formed on a surface of the single crystal region 4 by the dry oxidation method or the wet oxidation method by a pyrogenic technique. A polysilicon electrode 8 is formed on a portion of the base region 5 by a LPCVD method. The polysilicon electrode 8 may be a high melting point metal such as W or Mo or a silicide or polycide thereof. When the polysilicon is formed by the LPCVD method, a film is formed at a temperature of 600°-650° C., a pressure of 0.2-1.0 Torr and a $SiH_4$ flow rate of 20-100 sccm, and P is highly doped to a visinity of solid solution limit at 950° C. by deposition by $POCl_3$ or ion implantation. Then, ions are implanted into an emitter region 7 and a collector contact region 9 by using a mask pattern formed by photoresist.

Figure 2E:
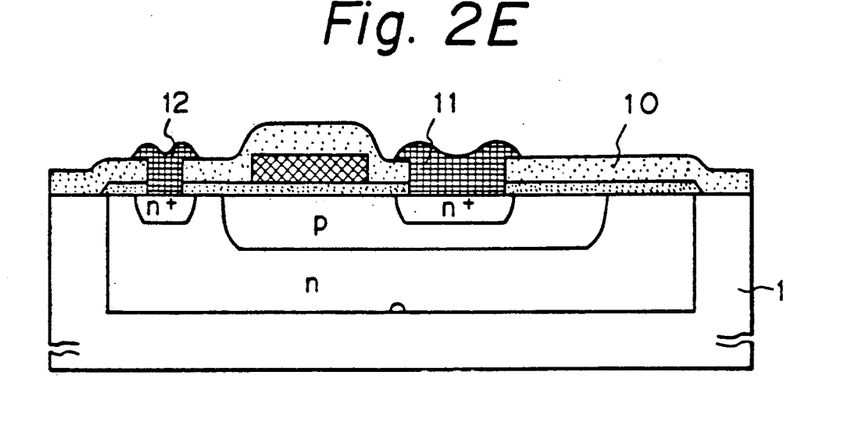
Figure 3A:
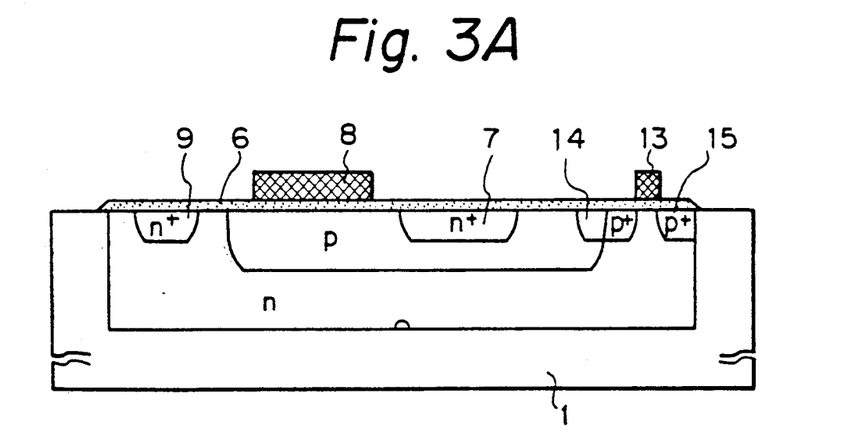
FIGS. 3(A) and 3(B) show longitudinal sectional views for illustrating a manufacturing process of a photoelectric converter having improved characteristics.
Figure 3B:
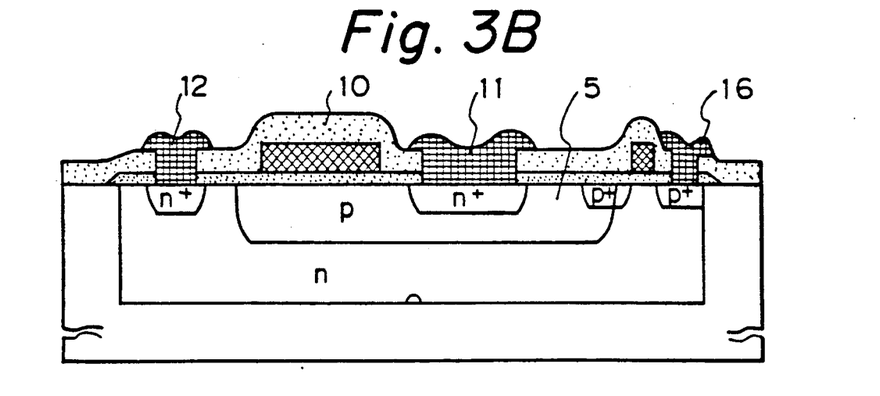

As shown in FIG. 2(E), an interlayer insulation layer 10 is deposited by the CVD method or the bias sputter method. Contact holes are formed by photo-etching, and electrodes 11 and 12 of the emitter region 7 and the collector contact region 9 are formed of Al, Al—Si, W, Mo, W silicide, Mo silicide, Ti or Ti silicide. In the present embodiment, since the substrate is made of a light transmissive material, the light may be irradiated to a back side of the substrate opposite to the recess. As a result, in the present embodiment, light is not blocked by the electrodes and Al wiring which were the causes of light blocking in the prior art converter. Accordingly, the characteristic of the photo-conversion cell can be improved without paying attention to the aperture factor of the cell. FIGS. 3(A) and 3(B) show longitudinal sectional views for illustrating a manufacturing process of the photoelectric converter having improved characteristic.

The process is identical to that of FIG. 2 until the gate oxidation film 6 is formed in FIG. 2(D). To compare with FIG. 2(E), a refresh PMOS transistor is added to the base region. It may be formed in the following manner.

After the gate oxidation film 6 has been formed, the base capacitor electrode 8 and the PMOS transistor gate electrode 13 are simultaneously formed by photoetching by using polysilicon, or Mo or W as shown in FIG. 3(A). The collector contact region 9 and the emitter region 7 are then formed by ion implantation, and a PMOS source region 14 and a drain region 15 are formed by ion implantation by using a self-alignment method.

As shown in FIG. 3(B), the interlayer insulation film 10 is deposited by the CVD method or the bias sputter method. Then, the collector electrode 12, emitter electrode 11 and PMOS source electrode 16 are formed. The PMOS is turned on in the refresh operation. As a result, the base potential is kept constant irrespective of the stored charge and a high speed refresh operation is attained and a residual image is prevented.

Since the light is irradiated on the back side of the converter, the formation of the PMOS on the front surface of the converter does not affect to the aperture factor.

A second embodiment of the photoelectric converter of the present invention will now be explained.

Figure 4:
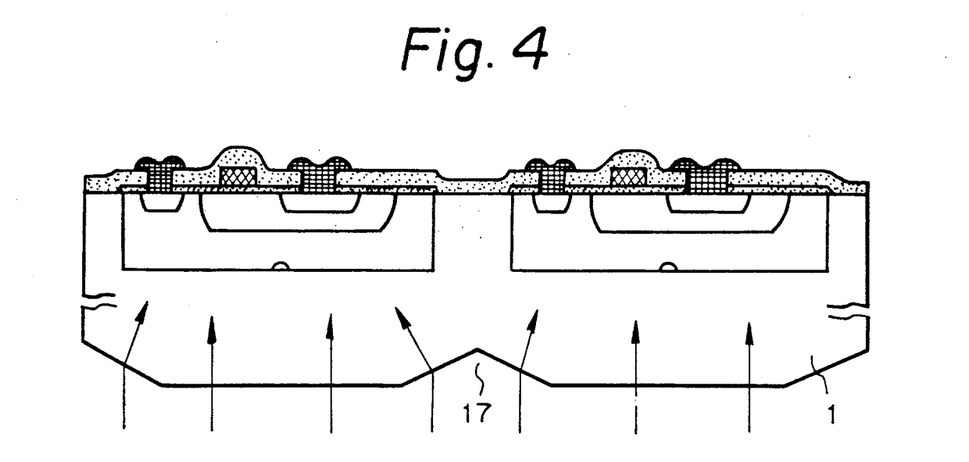
FIG. 4 shows a longitudinal sectional view of a second embodiment of the photoelectric converter of the present invention.

FIG. 4 shows a longitudinal sectional view of the second embodiment. It is manufactured by the same process as that of the first embodiment until the step of FIG. 2(E). In the present embodiment, a V-shaped groove 17 is formed by photo-etching in the back side of the light transmissive substrate 1. Preferably, the etching is done as isotropically as possible, and either dry etching or wet etching may be used. In accordance with the present embodiment, the V-shaped groove may be formed in the isolation region between the adjacent photoelectric conversion cells so that light irradiated to the isolation region is refracted on the single crystal region to effectively irradiate it. Further, cross-talk is reduced.

The back side process may be done after the photoelectric conversion cells have been formed or may be done prior to the formation of the photoelectric conversion cells and then the single crystal region and the photoelectric conversion cells may be formed.

In the present invention, the back side process for efficiently collecting the light is not limited to the V-shaped groove but it may be accomplished with a lens having a curved surface.

A third embodiment of the photoelectric converter of the present invention will now be explained.

Figure 5:
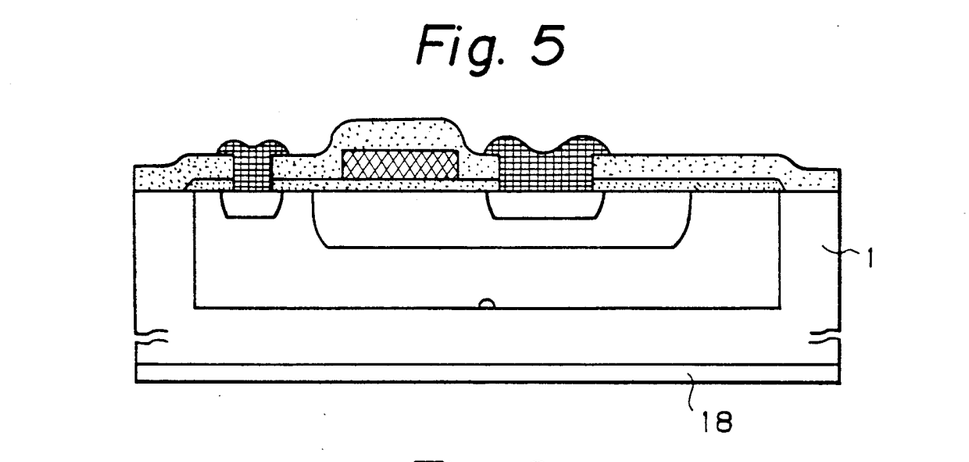
FIG. 5 shows a longitudinal sectional view of a third embodiment of the photoelectric converter of the present invention.

FIG. 5 shows a longitudinal sectional view of the third embodiment. It is manufactured by the same process as that of the first embodiment until the step of FIG. 2(E).

In the present embodiment, the light transmissive substrate 1 has a light transmissive layer 18 of a different optical property added thereto. The layer 18 may be a non-reflection layer for suppressing diffused reflection of the incident light on the substrate surface, or a color filter layer.

The non-reflection layer may be a single layer of $MgF_2$, $ZrO_2$, and $Al_2O_3$ or laminated plural layers of them.

The color filter layer may be formed by appropriately combining yellow, cyan and magenta dies or blue, red and green filter films by using photo-etching or a lift-off technique. The filter film may be formed by a single layer of perylene pigment or a laminated layer of perylene pigment and isoindolinone pigment for a red filter, a single layer of starocyanine pigment or a laminated layer of starocyanine pigment and isoindolynone pigment for a green filter, and a single layer of starocyanine for a blue filter.

A fourth embodiment of the photoelectric converter of the present invention will now be explained.

Figure 6:
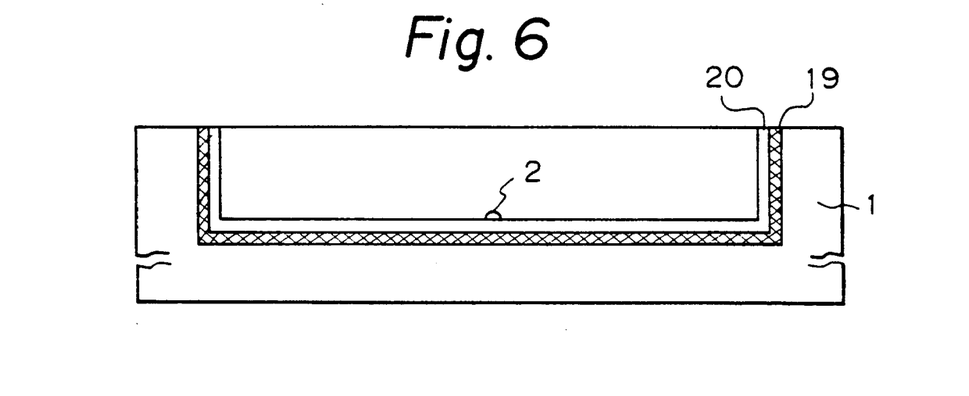
FIG. 6 shows a longitudinal sectional view for illustrating a manufacturing process of a fourth embodiment of the photoelectric converter of the present invention.

FIG. 6 shows a longitudinal sectional view of a manufacturing step of the fourth embodiment.

The photoelectric converter of the present embodiment produces a reference output in a dark state and is used with a photo-sensing photoelectric conversion cell.

A recess is formed in the light transmissive substrate 1, and a polysilicon film 19 is deposited by the LPCVD method. The polysilicon film 19 is formed to block the light. It is removed except for the cell area.

The polysilicon is then thermally oxidized to form a $SiO_2$ layer 20, and a heterogeneous deposition surface ($S_{NDL}$) 2 for nuclearization is formed of material different from $SiO_2$. The subsequent steps are identical to those of FIGS. 2(B)–2(E).

In the present embodiment, since the entire single crystal region is covered by the polysilicon film 19 and the light is blocked, the effect of light irradiation is substantially eliminated.

The output of such a dark cell corresponds to a dark signal of the other photoelectric conversion cells. Accordingly, by subtracting the output of the dark cell from the output of the other photoelectric conversion cells, an electrical signal which exactly represents the incident light is produced.

A method for forming the single crystal region 4 on the light transmissive substrate 1 will now be explained in detail detail.

In order to make complete the understanding of the present invention, a selective deposition method for selectively forming a deposition film on the deposit will be first explained. In the selective deposition method, the thin film is selectively formed on the substrate by utilizing a difference between factors of materials which are influential to the nuclearization in the thin film formation process such as surface energy, deposition coefficient, separation coefficient and surface diffusion rate.

Figure 7A:
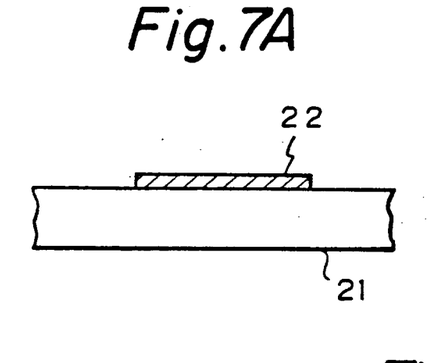
FIGS. 7(A) and 7(B) illustrate a selective deposition method.
Figure 7B:
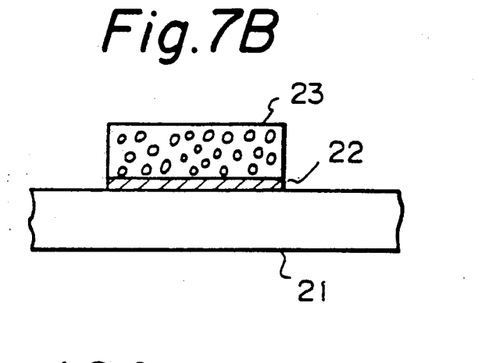

FIGS. 7(A) and 7(B) illustrate the selective deposition method. As shown in FIG. 7(A), a thin film 22 of a material having the above factors different from that of the substrate 21 is formed on the substrate 21. If the thin film of an appropriate material is deposited under an appropriate deposition condition, the thin film 23 grows only on the thin film 22 and does not grow on the substrate 21. By utilizing this phenomenon, the thin film 23 formed in self-alignment can be grown and the resist or lithography process used in the prior art process is not necessary.

The materials for such selective deposition method are $SiO_2$ for the substrate 21, and Si, GaAs or silicon nitride for the thin film 22, and Si, W, GaAs and Inp for the thin film 23 to be deposited.

Figure 8:
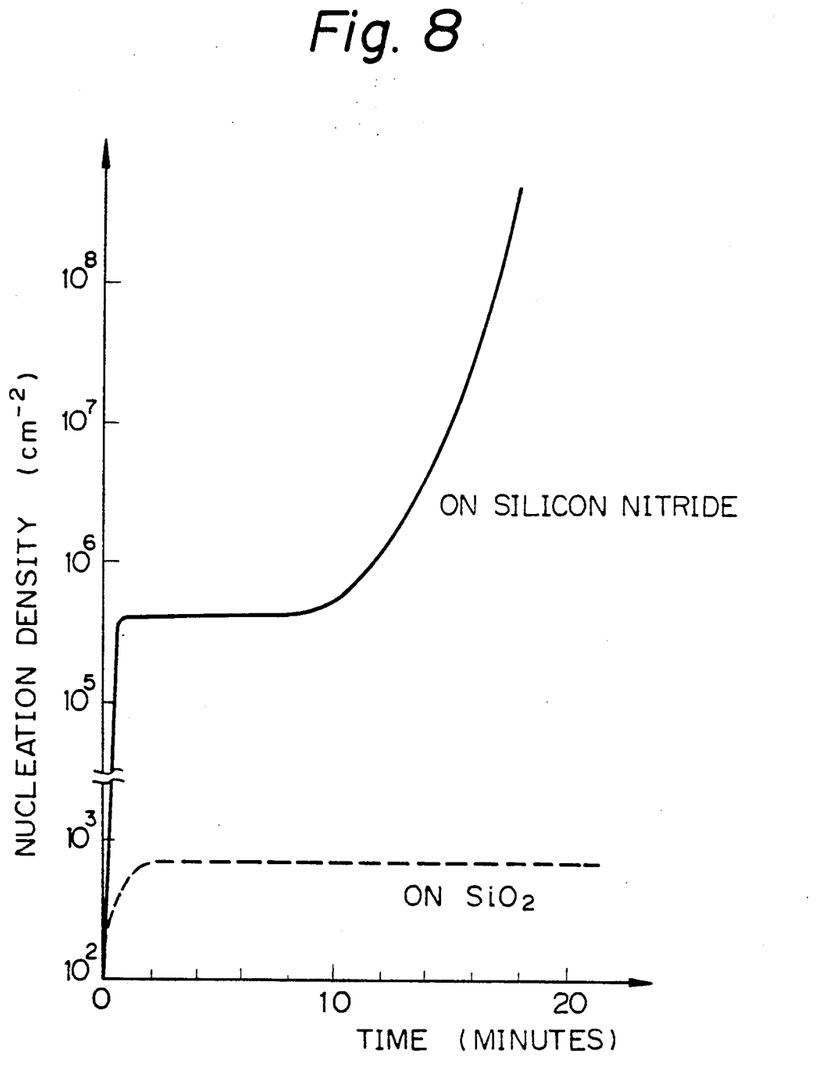
FIG. 8 shows a graph of nuclear formation densities on a $S:O_2$ deposit and a silicon nitride deposit.

FIG. 8 shows a graph of nuclearization densities on the deposit of $SiO_2$ and the deposit of silicon nitride. As shown, the nuclearization density on $SiO_2$ saturates at less than $10^3 \, cm^{-2}$ soon after the start of deposition, and the value does not significantly change 20 minutes later.

On the other hand, the nuclearization density on the silicon nitride ($Si_3N_4$) saturates at $4 \times 10^5 \, cm^{-2}$ and does not change for ten minutes, but it abruptly increases thereafter. In this example, the $SiCl_4$ gas is diluted by the $H_2$ gas and deposition is made at a pressure of 175 Torr and a temperature of 1000° C. by the CVD method. The same action may be attained by using reaction gas of $SiH_4$, $SiH_2Cl_2$, $SiHCl_3$ or $SiF_4$ and adjusting the pressure and temperature. Vacuum deposition may be used.

The nuclearization on the $SiO_2$ raises no substantial problem. By adding the HCl gas to the reaction gas, the nuclearization on the $SiO_2$ can be further suppressed so that the deposition of Si on the $SiO_2$ is completely blocked.

Such phenomenon is largely due to the differences between the $SiO_2$ and the silicon nitride in the absorption coefficient, the separation coefficient, and the surface diffusion coefficient to Si. However, but it is also the cause of the selective deposition that $SiO_2$ reacts to the Si atoms themselves, $SiO_2$ is etched by the generation of silicon monoxide having a high vapor pressure while the etching does not occur on the silicon nitride.

(Journal of Applied Physics, 53, 6839, 1982, by T. Yonehara, S. Yoshioka and S. Miyazawa).

By selecting $SiO_2$ and silicon nitride as the materials for the deposit surface and silicon as the deposit material, a sufficiently large nuclearization density difference ($\Delta_{ND}$) is attained as shown in FIG. 8. The material of the deposit surface is preferably $SiO_2$, but $SiO_2$ may be used to attain a large nuclearization density difference ($\Delta_{ND}$).

The above-discussed materials are not restrictive and any other materials may be used so long as one nuclearization density difference ($\Delta_{ND}$) is at least 103 times as high as that of the other. The materials described hereinafter can also be used for the selective deposition.

Another method to attain the nuclearization density difference ($\Delta_{ND}$) is to locally implant Si or N ions to $SiO_2$ to form a region which includes excess Si or N. According to the present invention, by using the selective deposition method on the basis of the nucleation density difference ($\Delta_{ND}$), and forming the deposition surface of the heterogeneous material having a sufficiently larger nuclearization density than that of the material of the deposit surface into a sufficiently fine areas are to permit the formation of only one nucleus, the single crystal can be selectively grown at the area where the fine heterogeneous material is present.

Since the selective growth of the single crystal is determined by the electron state of the deposit surface, particularly by a dangling bond state, a material having a low nuclearization density (for example, $SiO_2$) need not be bulk material and it may be formed on only material or substrate.

FIGS. 9(A)-9(D) show a manufacturing process of the single crystal according to the present invention. FIGS. 10(A) and 10(B) show perspective views of the substrate shown in FIGS. 9(A) and 9(D).

Figure 9A:
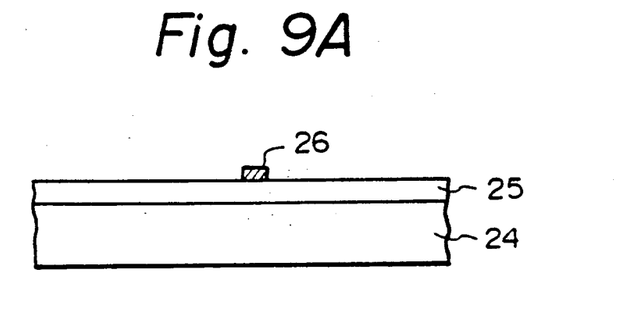
FIGS. 9(A)-9(D) show steps of a single crystal formation method.
Figure 10A:
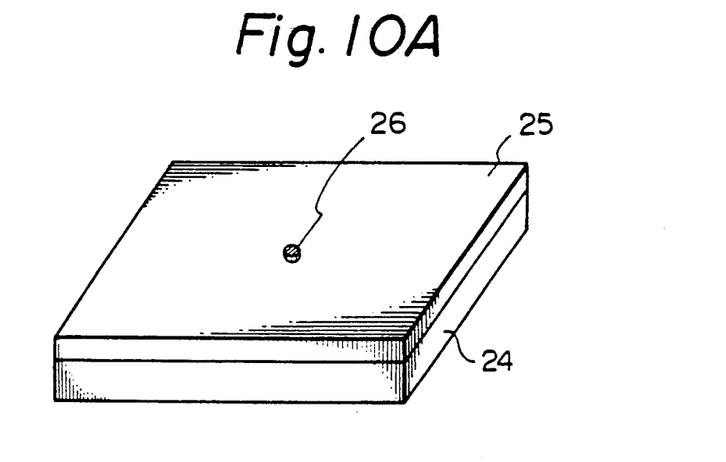
FIGS. 10(A) and 10(B) show perspective views of a substrate in FIGS. 7(A)-7(D)
Figure 10B:
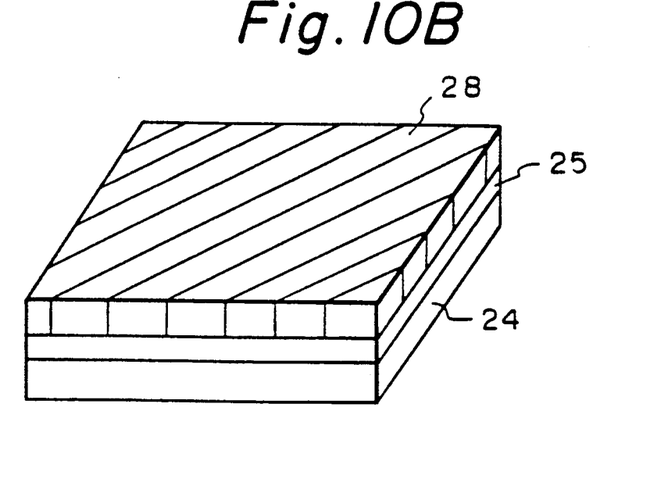

As shown in FIGS. 9(A) and 10(A), the thin film 25 having a low nuclearization density to allow selective deposition is formed on the substrate 24, the heterogeneous material having a high nuclearization density is thinly deposited thereon, and it is patterned by lithography to form the sufficiently fine deposition surface ($S_{NDL}$) 26. The size, crystal structure and composition of the substrate 24 may be arbitrary and the substrate may include a functional device of conventional semiconductor material. The deposition surface ($S_{NDL}$) 26 of heterogeneous material includes a modified area having excess Si or N formed by ion-implanting Si or N into the thin film 25.

Figure 9B:
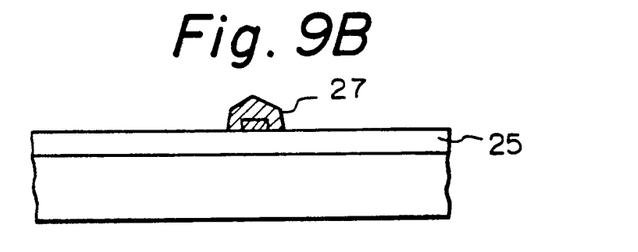

The single nucleus of the thin film material is formed only on the deposition surface ($S_{NDL}$) 26 of the heterogeneous material under an appropriate deposition condition. The deposition surface ($S_{NDL}$) 26 of the heterogeneous material must be formed sufficiently finely to permit the formation of the single nucleus. The size of the deposition surface ($S_{NDL}$) 26 may be less than several microns although it may vary with the material. The thin film material grows, while it maintains the single crystal structure, into the island-like single crystal grain 27 as shown in FIG. 9(B). As described above, it is necessary to establish a condition such that the nuclearization does not take place on the thin film 25.

Figure 9C:
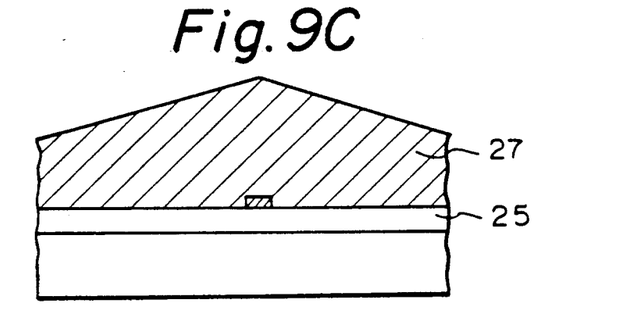

The island-like single crystal grain 27 further grows around the deposition surface ($S_{NDL}$) 26 while it maintains the single crystal structure and finally covers the entire thin film 25 as shown in FIG. 9(C).

Figure 9D:
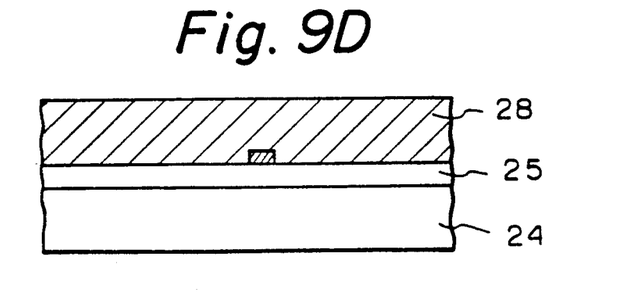

Then, the single crystal grain 27 is flattened by etching or polishing so that the single crystal layer 28 in which a desired device may be formed is formed on the thin film 25 as shown in FIGS. 9(D) and 10(B).

Since the thin film 25 is formed on the substrate 24, the material of the supporting substrate 24 may be arbitrary, and even if the substrate 24 has a functional device formed thereon, the single crystal layer can be readily formed thereon.

In the above embodiments, the surface of substrate 24 comprises the thin film 25. Alternatively, the single crystal layer may be formed by using a substrate made of low nuclearization density material to allow selective deposition.

EXAMPLE

A specific example of forming the single crystal layer will now be explained.

$SiO_2$ is used as a deposit surface forming material for the thin film 25. A quartz substrate may be used as the substrate, or an $SiO_2$ layer may be formed on a substrate such as metal, semiconductor, magnetic material, piezoelectric material or insulative material by sputtering, CVD or vacuum deposition. The thin film 25 forming material is preferably $SiO_2$ although $SiO_x$ may also be used.

A silicon nitride ($Si_3N_4$) layer or polycrystalline silicon layer is deposited as the deposition surface ($S_{NDL}$) forming material on the $SiO_2$ layer 25 by a depressured vapor deposition method, and the silicon nitride layer or polycrystalline silicon layer is patterned by a conventional lithography technique or a lithography technique which uses X ray, electron beam or ion beam, to form the fine deposition surface ($S_{NDL}$) 26 of less than several microns, preferably less than 1 micron. The size of the surface ($S_{NDL}$) may be several microns preferably smaller than 1 micron.

Then Si is selectively grown on the substrate 11 by using a gas mixture of HCl, $H_2$ and $SiH_2C_2$, $SiCl_4$, $SiHCl_3$, $SiF_4$ or $SiH_4$. The temperature is 700°–1100° C. and the pressure is approximately 100 Torr.

The single crystal Si grain 27 is grown around the fine deposition surface ($S_{NDL}$) 26 of heterogeneous material of the silicon nitride or polycrystalline silicon on the $SiO_2$ in several tens of minutes. It grows to more than several tens of microns in size under an optimum growth condition.

Then, only the Si is etched and flattened by reactive ion etching (RIE) having an etching rate difference between Si and $SiO_2$ so that the polycrystalline silicon layer having a controlled grain size is formed. A grain boundary is removed and the island-like single crystal silicon layer 28 is formed. When the surface roughness of the single crystal grain 27 is high, the surface is first mechanically ground and then etched A field effect transistor is formed in the single crystal silicon layer 28 of more than several tens of microns in size and having no grain boundary. The field effect transistor exhibits superior properties to a field effect transistor formed on a single crystal silicon wafer.

Since the device is electrically isolated from the adjacent single crystal silicon layer 28 by $SiO_2$, there is no mutual interference even if complementary field effect transistors (C-MOS) are fabricated. Since an activation layer of the device is thinner than that when the Si wafer is used, a malfunction due to a charge in the wafer created when a radiation beam is emitted is eliminated. Since stray capacitance is reduced, an operation speed of the device is improved. Since any substrate material may be used, the single crystal layer may be formed on a large substrate with a lower cost than that required when the Si wafer is used. Since the single crystal layer may be formed even on another semiconductor, a piezoelectric material, or a dielectric substrate, a multifunction three-dimensional integrated circuit can be attained.

Composition of Silicon Nitride

In order to attain a sufficient nuclearization density difference between the deposit surface (crystal growth surface) and the deposition surface ($S_{NDL}$) of material different from the former surface, the composition of silicon nitride is not limited to $Si_3N_4$ but other composition may be used.

In the plasma CVD method which forms the silicon nitride film at a low temperature by decomposing $SiH_4$ gas and $NH_3$ gas in an RF plasma, flow rates of $SiH_4$ gas and $NH_3$ gas are changed to control the composition of Si and N of the deposited silicon nitride.

Figure 11:
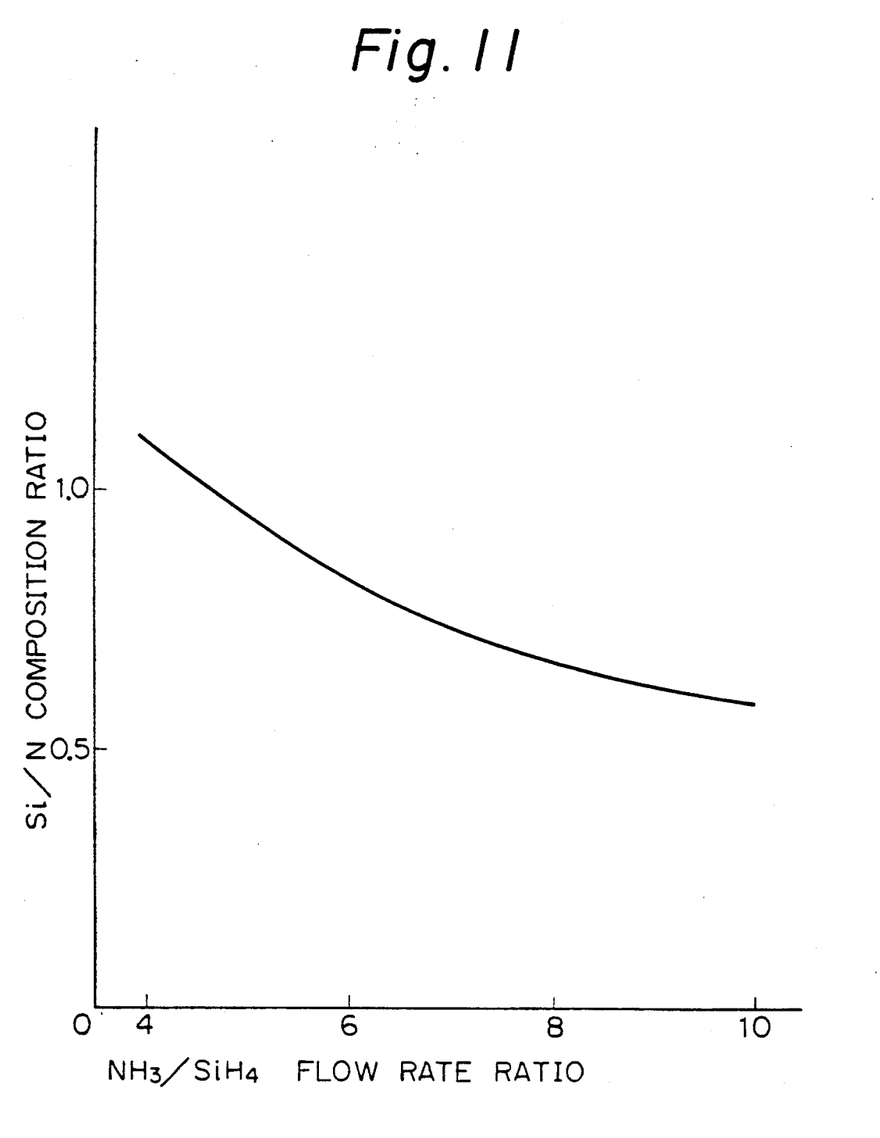
FIG. 11 shows a graph of flow rates of $SiH_4$ and $NH_3$ and a composition of Si and N of the silicon nitride film.

FIG. 11 shows a relation between a flow rate ratio of $SiH_4$ and $NH_3$ and a composition of Si and N in the silicon nitride film.

The deposition condition is an RF output of 175 watts and a substrate temperature of 380° C. The $SiH_4$ gas flow rate is fixed to 300 cc/min and the $NH_3$ gas flow rate is changed. When the flow rate ratio of $NH_3$ and $SiH_4$ gases is changed between 4 and 10, the Si/N ratio in the silicon nitride changes between 1.1 and 0.58 as proved by electron spectrography.

When $SiH_2Cl_2$ gas and $NH_3$ gas are introduced by the depressured CVD method and the silicon nitride is formed at 0.3 Torr and 800° C., the composition of the silicon nitride is close to stoichiometric composition of $Si_3N_4$ (Si/N=0.75).

When the silicon nitride film is formed by heat treatment of Si at 1200° C. in ammonium or $N_2$ gas (thermal nitrization), the composition is closer to the stoichiometric composition because the formation is under thermal balance.

By growing the nucleus of Si by using the silicon nitride thus formed as the deposit surface having higher nuclearization density than that of $SiO_2$, the nuclearization density difference is attained in accordance with the composition.

Figure 12:
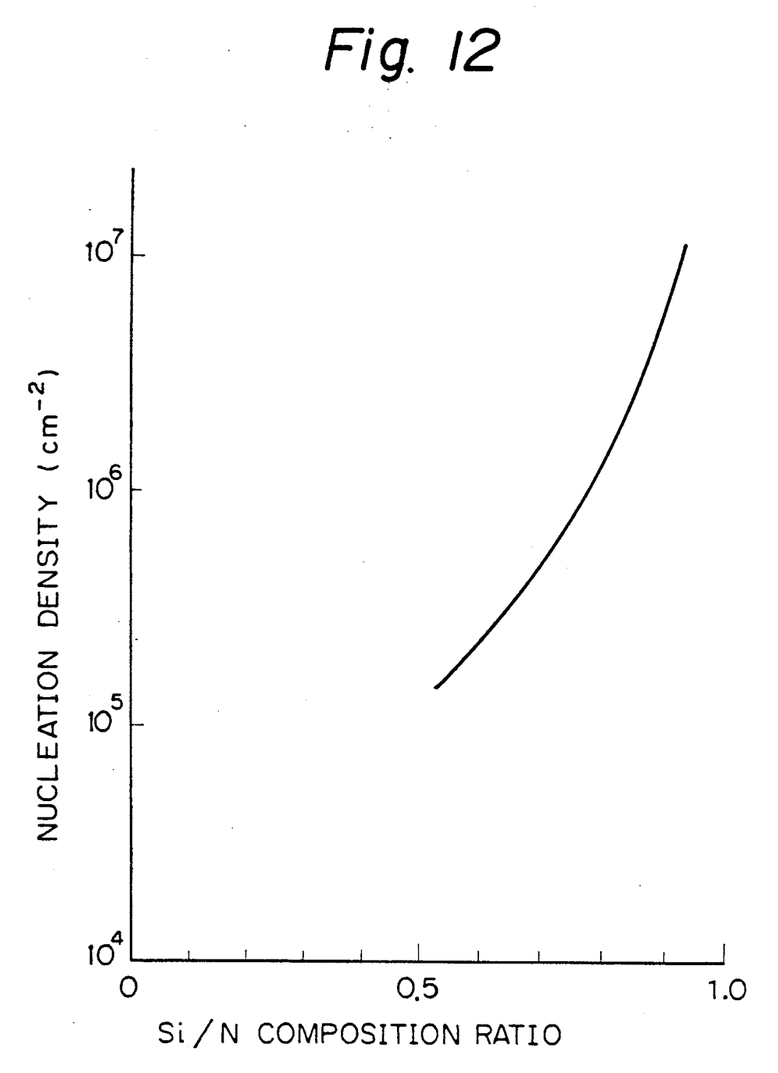
FIG. 12 shows a graph of the Si/N composition and the nuclear formation density.

FIG. 12 shows a relation between the Si/N composition and the nuclearization density. As shown, as the composition of the silicon nitride changes, the nuclearization density of Si grown thereon significantly changes.

The Si is grown at a $SiCl_4$ gas pressure of 175 Torr, and a $H_2$ reaction temperature of 1000° C.

The phenomenon of change of the nuclearization density with the composition of the silicon nitride influences the size of the silicon nitride which is the heterogeneous material formed sufficiently finely to permit the growth of single nucleus. That is, the silicon nitride having a large nuclearization density cannot form a single nucleus unless it is very finely formed.

Accordingly, it is necessary to select the nuclearization density and an optimum size of the silicon nitride to permit the growth of single nucleus. For example, under the deposition condition which attains the nuclearization density of approximately $10^5 cm^{-2}$, a single nucleus may be formed if the size of the silicon nitride is less than 4 microns.

Formation of deposition surface ($S_{NAL}$) by ion implantation.

In order to attain the nuclearization density difference from Si, ions of Si, N, P, B, F, Ar, He, C, As, Ga or Ge may be locally implanted in the $SiO_2$ which is a material for forming the deposit surface having a low nuclearization density to form a modified area in the deposit surface of $SiO_2$. The modified area may be used as a material for forming the deposit surface ($S_{NDL}$) having a high nuclearization density.

For example, the surface of $SiO_2$ is covered by a resist material and desired areas are exposed to light, developed, and dissolved to partially expose the $SiO_2$ surface.

Then, the $SiF_4$ gas is used as a source gas and Si ions are implanted in the $SiO_2$ surface at 10 KeV at a density of $1 \times 10^{16} - 1 \times 10^{18} cm^{-2}$. A projection fly path is 114 Å and the Si density on the $SiO_2$ surface is approximately $10^{22} cm^{-3}$. Since $SiO_2$ is inherently amorphous, the Si ion-implanted area is also amorphous.

In order to form the modified area, ions may be implanted by using the resist material as a mask, but the Si ions may be implanted in the $SiO_2$ surface by the focused ion beam technique without using the resist mask.

After the ion implantation, the resist material is removed and the modified area including excess Si is formed on the $SiO_2$ surface. Then, Si is vaporgrown on the $SiO_2$ deposit surface having the modified area formed therein.

Figure 13:
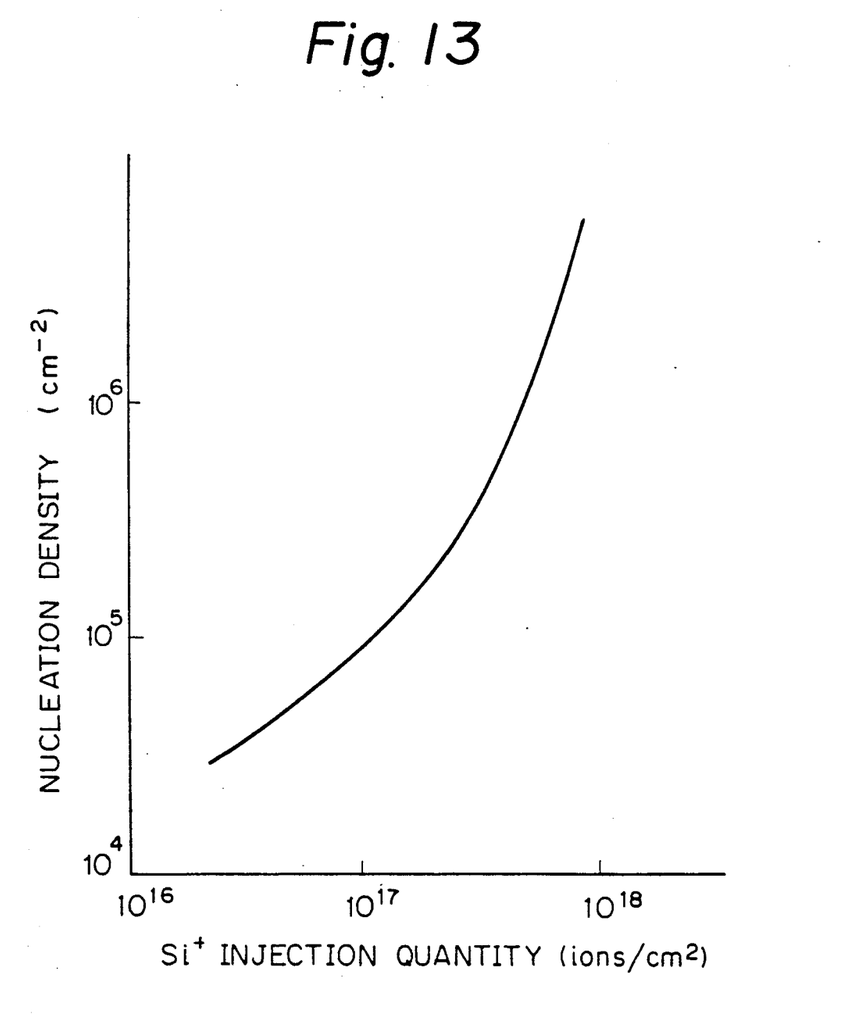
FIG. 13 shows a graph of a Si ion injection rate and the nuclear formation density.

FIG. 13 shows a relation of Si ion implantation quantity and the nuclearization density. As shown, the larger the $Si^+$ implantation quantity, the more the nuclearization density increases.

Accordingly, if the modified area is formed sufficiently finely, a single Si nucleus can be grown by using the modified area as the heterogeneous material and the single crystal can be grown as described before.

The formation of the modified area in a sufficiently fine area to permit the growth of single nucleus may be readily attained by patterning the resist or focusing the ion beam.

Method for Depositing Si Other Than CVD

In order to grow the single crystal by the selective nuclearization of Si, a method for evaporating Si in a vacuum ($< 10^{-6}$ Torr) by an electron gun and depositing it on a heated substrate may be used, in place of the CVD method. In a molecular beam epitaxy MBE method which vapor-deposits in high vacuum ($<10^{-9}$ Torr), the Si beam and $SiO_2$ start reaction at a substrate temperature of higher than 900° C. and the nuclearization of Si on the $SiO_2$ is stopped. (Journal of Applied Physics, 53, 10, p 6839, 1983, by T. Yonehara, S. Yoshioka and S. Miyazawa).

By using this phenomenon, the single Si nucleus is selectively formed on the fine silicon nitride area on the $SiO_2$ and the single crystal Si is grown thereon. The deposition condition is a vacuum of $10^{-8}$ Torr, an Si beam intensity of $9.7 \times 10^{14}$ atoms/$cm^2$·sec and a substrate temperature of 900°-1000° C.

A reaction product $SiO_2$ having a very high vapor pressure is produced by a reaction of $SiO_2 + Si \rightarrow 2SiO \uparrow$ and etching of $SiO_2$ by Si occurs by evaporation.

On the other hand, no such etching occurs on the silicon nitride but the nuclearization and deposition occur.

As a material for forming the deposition surface ($S_{NDL}$) having the high nuclearization density, tantalum oxide ($Ta_2O_5$) or silicon nitride oxide (SiON) may be used in place of silicon nitride to attain the same effect. This material is formed finely as the deposition surface ($S_{NDL}$) and the single crystal may be grown thereon in the same manner.

The single crystal area is formed on the light transmissive substrate by the single crystal formation method described above.

The photoelectric converter of the present embodiment offers the following advantages.

(1) Since a light transmissive substrate is used, the light incident on the back side can be used, and the aperture area is equal to the cell area. Accordingly, the photoelectric conversion efficiency is improved, the output is increased, and a high integration density is attained.

(2) By machining the light transmissive substrate into a lens, the light applied to the device isolation area can be directed into the photoelectric conversion cell. Thus, light collection efficiency is improved and cross-talk is reduced.

(3) By forming the anti-reflection coating or color filter on the light transmissive substrate, the substrate may be used as a protective film to protect the cell from the contamination material which has been a defect in a conventional on-chip filter.

(4) By covering the entire single crystal area with polysilicon film 19 to block the light, light irradiation can be substantially eliminated and a reference output is produced in a dark state.

We claim:

1. A method for producing photoelectric conversion apparatus comprising a light transmissive substrate, a semiconductor region provided on said substrate, and a wiring portion provided on said semiconductor region, and capable of outputting a signal responsive to light incident from said substrate side, comprising steps of:
    (a) preparing a light transmissive substrate having an amorphous deposition surface of a different material than said substrate, said amorphous deposition surface having a nucleation density greater than any other surface on the substrate and having a sufficiently small area so as to form thereon only a single nucleus from which a single crystal is grown, the area size being of the order of a few um;
    forming the single nucleus on the amorphous deposition surface;
    (c) growing the single crystal from the nucleus by vapor deposition;
    (d) forming on said substrate a transistor having a main electrode region of a first conductivity type and a control electrode region of a conductivity type opposite to the first type; and
    (e) forming on said substrate a wiring portion connected to the transistor.

2. A method according to claim 1, wherein said single crystal comprises a silicon, and said amorphous deposition surface comprises a silicon nitride, and said light transmissive substrate comprises a silicon oxide.

3. A method according to claim 1, wherein said single crystal comprises a silicon, and said amorphous deposition surface comprises a modified area formed by performing an ion implantation locally on said light transmissive substrate surface.

4. A method according to claim 1, wherein said light transmissive substrate comprises a substrate with a silicon oxide layer formed thereon.

5. A method for producing a photoelectric conversion apparatus, comprising the steps of:
    forming a light transmissive substrate having a deposition surface and a bottom surface, the substrate having a first nucleation density, and said bottom surface receiving light and passing it through the substrate;
    forming an amorphous heterogeneous deposition surface on said substrate deposition surface, said amorphous heterogeneous deposition surface having a second nucleation density higher then said first nucleation density, said amorphous heterogeneous deposition surface having an area dimensioned to permit growth of a single nucleus of a single crystal material;
    forming a photoelectric conversion region of said single crystal material gown on said amorphous heterogeneous deposition surface, said region receiving light passed through said substrate bottom surface; and
    forming in and on said single crystal material a photoresponsive transistor including said region, said transistor including wiring disposed on a top of said region on a surface opposite a surface which receives light, said transistor also including (1) a main electrode region of a first conductivity type, (2) a controlled electrode region of a second conductivity type floating to store photoexcited carriers therein, and (3) a junction formed between said main and control electrode regions and capable of being forward biased to output a signal corresponding to the stored carriers.

* * * * *

UNITED STATES PATENT AND TRADEMARK OFFICE
CERTIFICATE OF CORRECTION

PATENT NO. : 5,013,670
DATED : May 7, 1991
INVENTOR(S) : SHIRO ARIKAWA ET AL.

It is certified that error appears in the above-identified patent and that said Letters Patent is hereby corrected as shown below:

COLUMN 1

Line 13, "thereof" should read --is--.
　　　　Line 31, "and" should be deleted.
　　　　Line 57, "rise" should read --rises--.

COLUMN 2

Line 41, "more" should read --move--.
　　　　Line 51, "the" should read --a--.
　　　　Line 53, "electrode the" should read --electrode.  The--.
　　　　Line 54, "stored a" should read --stored carriers.  A--.

COLUMN 3

Line 4, "(silicon-on-saphire)" should read
　　　　　　　--(silicon-on-sapphire)--.
　　　　Line 8, "comtamination" should read --contamination--.

COLUMN 4

Line 23, "visinity" should read --vicinity--.
　　　　Line 46, "characteristic." should read
　　　　　　　--characteristics.--.

COLUMN 5

Line 3, "to" should be deleted.

UNITED STATES PATENT AND TRADEMARK OFFICE
CERTIFICATE OF CORRECTION

PATENT NO. : 5,013,670
DATED : May 7, 1991
INVENTOR(S) : SHIRO ARIKAWA ET AL.      Page 2 of 3

It is certified that error appears in the above-identified patent and that said Letters Patent is hereby corrected as shown below:

COLUMN 6

Line 16, "detail" (first occurrence) should be deleted.
Line 64, "but" should be deleted.
Line 66, "themselves," should read --themselves.--.

COLUMN 7

Line 12, "103 times" should read --$10^3$ times--.
Line 24, "areas" should read --area--.

COLUMN 8

Line 34, "microns" should read --microns,--.
Line 53, "etched" should read --etched.--.

COLUMN 9

Line 14, "tion" should read --tions--.
Line 37, "anmonium" should read --ammonium--.
Line 56, "single" should read --a single--.
Line 62, "single" should read --a single--.
Lines 67-68, "Formation of deposition surface ($S_{NAL}$)
         by ion implantation." should read
         --Formation of deposition surface ($S_{NDL}$)
            by ion implantation-- and should be a heading.

COLUMN 10

Line 36, "single" should read --a single--.

UNITED STATES PATENT AND TRADEMARK OFFICE
CERTIFICATE OF CORRECTION

PATENT NO. : 5,013,670
DATED : May 7, 1991
INVENTOR(S) : SHIRO ARIKAWA ET AL.  Page 3 of 3

It is certified that error appears in the above-identified patent and that said Letters Patent is hereby corrected as shown below:

COLUMN 11

Line 29, "photoelectric" should read --a photoelectric--.
    Line 34, "steps" should read --the steps--.
    Line 44, "forming" should read --(b) forming--.

COLUMN 12

Line 27, "then" should read --than--.
    Line 33, "gown" should read --grown--.

Signed and Sealed this

Eighteenth Day of May, 1993

Attest:

MICHAEL K. KIRK

Attesting Officer    Acting Commissioner of Patents and Trademarks